United States Patent
Nakajima et al.

(10) Patent No.: US 6,224,676 B1
(45) Date of Patent: May 1, 2001

(54) GAS SUPPLY APPARATUS AND FILM FORMING APPARATUS

(75) Inventors: Katsunori Nakajima; Hiroyuki Shida; Eiji Setoyama; Koji Ishiguro; Hikaru Saruta, all of Hitachi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/451,911

(22) Filed: Dec. 1, 1999

(30) Foreign Application Priority Data

Dec. 2, 1998 (JP) .................................................. 10-342922

(51) Int. Cl.$^7$ ..................................................... C23C 16/00
(52) U.S. Cl. ........................................... 118/707; 118/715
(58) Field of Search ....................................... 118/707, 715

(56) References Cited

FOREIGN PATENT DOCUMENTS 6-284061   10/1994   (JP) .

*Primary Examiner*—Richard Bueker
(74) *Attorney, Agent, or Firm*—Mattingly, Stanger & Malur, P.C.

(57) ABSTRACT

According to the present invention, a signal transmission system is arranged in a region surrounded by a gas control means and a plurality of blocks whereby a region between elements constituting a gas supply flow path can be utilized for the region of the signal transmission system thereby to make the occupying space small and miniaturize the apparatus.

6 Claims, 4 Drawing Sheets

GAS FLOW

GAS SUPPLY APPARATUS AND FILM FORMING APPARATUS

BACKGROUND OF THE INVENTION

The present invention relates to a gas supply apparatus, and particularly, to a gas supply apparatus suitable for supplying gas such as process gas to a reaction chamber for forming an insulating film on a semiconductor wafer.

In a process of manufacturing a memory such as DRAM of a semiconductor and a CPU such as a microcomputer, an interlayer insulating film such as silicon dioxide ($SiO_2$) is used in forming an insulating film on a semiconductor wafer. As a film forming apparatus for forming the interlayer insulating film on the semiconductor wafer, a plasma CVD (Chemical Vapor Deposition) apparatus is used. The plasma CVD apparatus is provided with a reaction chamber for receiving process gas to form an interlayer insulating film on a semiconductor wafer, into which reaction chamber are supplied silane ($SiH_4$), argon (Ar), oxygen ($O_2$) or the like as process gas. In the maintenance, nitrogen ($N_2$) as gas for purge or gas dilution is supplied to the reaction chamber, and in the cleaning, gas such as nitrogen trifluoride ($NF_3$) is supplied thereto. As disclosed in Japanese Patent Laid-open No. Hei 6-284061, the gas supply apparatus for supplying these gases to the reaction chamber proposed so far employs a module mounting construction in which groups of blocks constituting one element of a gas supply flow path are dispersed and arranged on the base, a flow control valve (MFC: Mass Flow Controller) or an operating valve is arranged between the blocks, and opposite ends of the MFC or the operating valve are locked to the blocks by means of bolts to shorten the overall length of the gas supply apparatus.

When the module mounting construction for locking the MFC or the operating valve on the blocks is employed in place of connecting the MFC or the operating valve by means of pipes, the overall length of the gas supply apparatus can be shortened, and the MFC or the operating valve can be locked to the blocks by means of bolts from an upper portion, thus facilitating the maintenance of MFC.

However, the prior art has a construction in which a cable for supplying power and a signal to the MFC is connected from the upper portion of the MFC. It is necessary to have room for the cable in consideration of an allowable radius of curvature of the cable. This sometimes results in that the cable is projected upward of the MFC, the height of the whole MFC increases, and the space in height is restricted. Further, since the cable is installed in the air, it is sometimes in the way when the MFC is removed unless processing of the cable is taken into consideration. Moreover, since a cable is long, the MFC is sometimes erroneously operated due to noises.

It is an object of the present invention to provide a gas supply apparatus capable of making use of a region between elements constituting a gas supply flow path for a region for a signal transmission system to reduce an occupying space.

SUMMARY OF THE INVENTION

For achieving the aforementioned object, according to the present invention, there is provided a gas supply apparatus comprising: block groups arranged in a relation spaced apart from each other to constitute one element of a gas supply flow path; a gas control means arranged adjacent to a plurality of blocks out of the block groups to constitute one element of the gas supply flow path and receiving a supply of power and a signal to control a flow of gas; and a signal transmission means for transmitting power and a signal to the gas control means, wherein the gas control means is united with the plurality of blocks adjacent to each other in a direction crossing a line for joining the blocks adjacent to each other in such a manner as to be mounted on partial regions of the adjacent blocks, and is connected to the gas supply flow path of the plurality of blocks adjacent to each other through the partial regions, and the signal transmission means is arranged in a region between the blocks adjacent to each other out of regions adjacent to the partial regions.

Alternatively, in constituting the gas supply apparatus, there can be employed a constitution in which a plurality of gas control means are provided, and power and a signal are transmitted from the signal transmission means to the respective gas control means.

In constituting the gas supply apparatus, the following elements can be added.

(1) The block groups are secured onto a base, the gas control means is provided with a signal input portion on the surface opposed to the base, and the signal transmission means comprises a uniting portion detachably united with the signal input portion of the gas control means, a power supply line and a signal line connected to the uniting portion, and a support portion secured onto the base to support the uniting portion, the power supply line and the signal line being wired along the support portion.

(2) An external uniting portion connected to the power line and the signal line, to which are connected a power line and a signal line different from the first mentioned power line and signal line is secured in a state of being exposed to the surface or the side of the support portion.

(3) The block groups are secured onto the base, the gas control means is provided with a signal input portion on the surface opposed to the base, and a power supply line and a signal line for transmitting power and a signal to the gas control means are wired along the base and connected to the signal input portion.

(4) A power supply for supplying power to the gas control means is secured to a position corresponding to the gas control means out of surfaces opposite to the block secured surface of the base, and a power supply line connected to the power supply is inserted into the base and connected to a signal input portion of the gas control means.

Further, according to the present invention, there is provided a film forming apparatus comprising: a reaction chamber for receiving a supply of process gas to deposit a film on a film forming subject; and a gas supply means for supplying process gas to the reaction chamber, wherein the gas supply apparatus is arranged in close proximity to the reaction chamber, the gas supplying apparatus comprising block groups arranged in a relation spaced apart from each other to constitute one element of a gas supply flow path, a gas control means arranged adjacent to a plurality of blocks out of the block groups to constitute one element of the gas supply flow path and receiving a supply of power and a signal to control a flow of gas, and a signal transmission means for transmitting power and a signal to the gas control means; the gas control means being united with the plurality of blocks adjacent to each other in a direction crossing a line for joining the blocks adjacent to each other in such a manner as to be mounted on partial regions of the adjacent blocks, and being connected to the gas supply flow path of the plurality of blocks adjacent to each other through the partial regions, the signal transmission means being arranged in a region between the blocks adjacent to each other out of regions adjacent to the partial regions.

According to the means, since the signal transmission means constituting a signal transmission system is arranged in a region surrounded by the gas control means and a plurality of blocks, a region between elements constituting the gas supply flow path can be utilized for the region of the signal transmission system, enabling reduction in occupying space. That is, the entire apparatus can be lowered in height. Further, the power supply is arranged on the surface opposite to the block secured surface of the base whereby the wiring of the power supply line is shortened to prevent the gas control means from being erroneously operated due to the noise, and the apparatus can be miniaturized. Further, the gas supply apparatus is arranged in the vicinity of the reaction chamber whereby the length of the gas supply flow path can be shortened, the occupying area of the film forming apparatus can be made small, and the time till gas is stabilized when gas is supplied can be shortened. Furthermore, the time till the reaction chamber assumes the regular vacuum after stoppage of gas can be shortened, enabling contribution to enhancement of through-put.

DETAILED DESCRIPTION OF THE PREFERRED EMBODIMENTS

One embodiment of the present invention will now be described with reference to the drawings.

Figure 1:
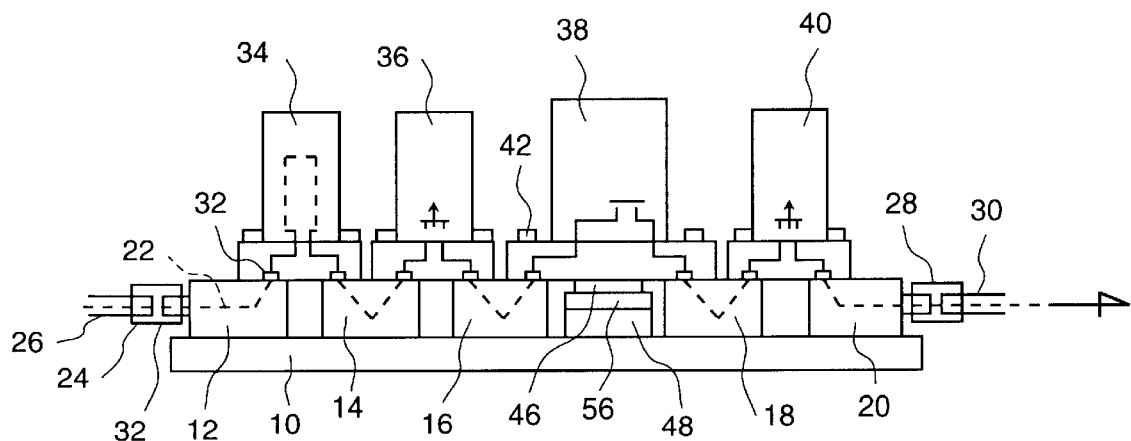
FIG. 1 is a front view showing main parts of a gas supply apparatus according to one embodiment of the present invention.
Figure 2:
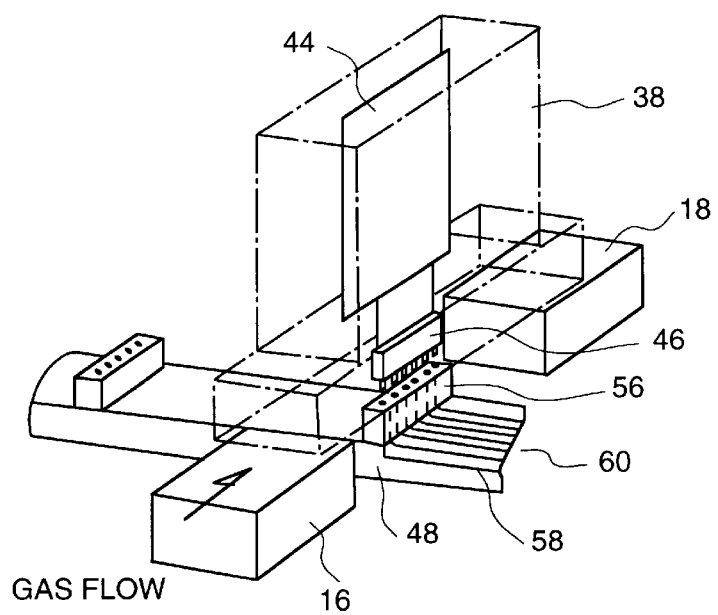
FIG. 2 is a perspective view showing main parts of the gas supply apparatus shown in FIG. 1.
Figure 3:
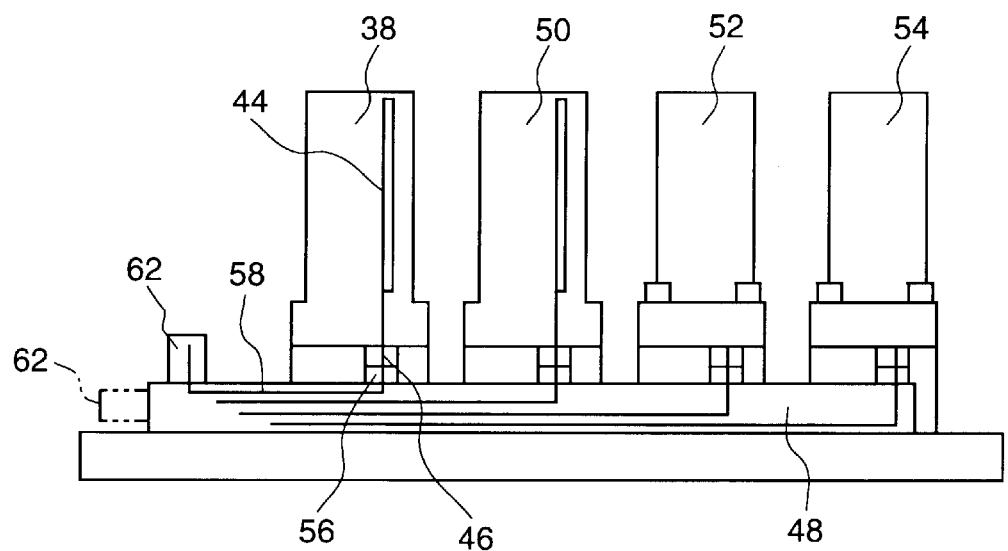
FIG. 3 is a side view showing main parts of a gas supply apparatus according to one embodiment of the present invention.

FIG. 1 is a front view showing main parts of a gas supply apparatus according to one embodiment of the present invention; FIG. 2 is a perspective view showing main parts of the gas supply; and FIG. 3 is a side view showing main parts of the gas supply apparatus. Referring to FIGS. 1 to 3, the gas supply apparatus constitutes a gas supply flow path, as one element of a plasma CVD apparatus (a film forming apparatus), which supplies process gases such as silane, argon, oxygen or the like to a reaction chamber, and supplies nitrogen as gas for purge or gas dilution to the reaction chamber, wherein on a base 10 made of aluminum in the form of a flat plate are arranged manifold blocks 12, 14, 16, 18 and 20, as block groups constituting one element of the gas supply flow path, in a relation spaced apart from each other and secured. Each of the manifold bocks 12 to 20 is formed into a cubical shape and is internally formed with a through-hole 22 as a gas supply flow path. Further, Each of the manifold bocks 12 to 20 constitutes a gas supply flow path of one system out of gas supply flow paths of four systems (in FIG. 1, other three systems are omitted). The manifold block 12 is connected to a gas supply source through a coupling 24 and a stainless steel pipe 26, and the manifold block 20 is connected to a reaction chamber through a coupling 28 and a stainless steel pipe 30. A metal C-ring 32 is mounted within each of the couplings 24 and 28. On each of the manifold blocks 10 to 20 are arranged a filter 34, an operating valve 36, an MFC (Mass Flow Controller) 38, and an operating valve 40 through a metal C-ring.

The filter 34, the operating valve 36, the MFC 38, and the operating valve 40 are united with a plurality of manifold blocks adjacent to each other in a direction crossing a line for joining the manifold blocks adjacent to each other and the manifold block, that is, in a direction (a vertical direction) crossing relative to the base 10 in such a manner as to be mounted on partial regions of the adjacent blocks, and are secured to the upper surfaces of the respective manifold blocks 12 to 20 by means of hexagonal bolts 42. Further, the filter 34, the operating valves 36 and 40, and the MFC 38 each constitute one element of the gas supply flow path, and the filter 34 removes impurities contained in gas in the gas supply flow path. The operating valves 36 and 40 open and close the gas supply flow path in response to a signal from an electromagnetic valve manifold described later. The MFC 38 is constituted as a gas control means (a gas flow-rate control valve) for receiving a supply of power and a signal to control the flow rate of gas in the gas supply flow path, and a control board 44 is provided within the MFC 38. A thermal type mass flow-rate sensor, a bridge circuit, an amplifier, a comparator, a control valve and so on are actually mounted on the control board 44, and a male type connector 46 as a signal input portion is provided on the bottom portion of the control board 44. A power supply and signal transmission portion 48 is inserted into a region below the connector 46, that is, in a region surrounded by the base 10, and the manifold blocks 16 and 18.

The power supply and signal transmission portion 48 is arranged over the regions below other 3-system MFC 50, 52 and 54, as shown in FIG. 3, the power supply and signal transmission portion 48 being formed into a box-shape as a support portion. A female connector 56 as a uniting portion is secured onto the power supply and signal transmission portion 48, the connector 56 being supported by the power supply and signal transmission portion 48. The connector 56 is detachably united with the connector 46 of the MFC 38, and a power supply line 58 and a signal line 60 are connected to the connector 56. The power supply line 58 and the signal line 60 are wired within and along the power supply and signal transmission portion 48, and connected to a connector 62. The connector 62 is secured to the surface of the power supply and signal transmission portion 48 as an external uniting portion. It is noted that the connector 62 may be fixed to the side or bottom of the power supply and signal transmission portion 48 in an exposed state.

Figure 4:
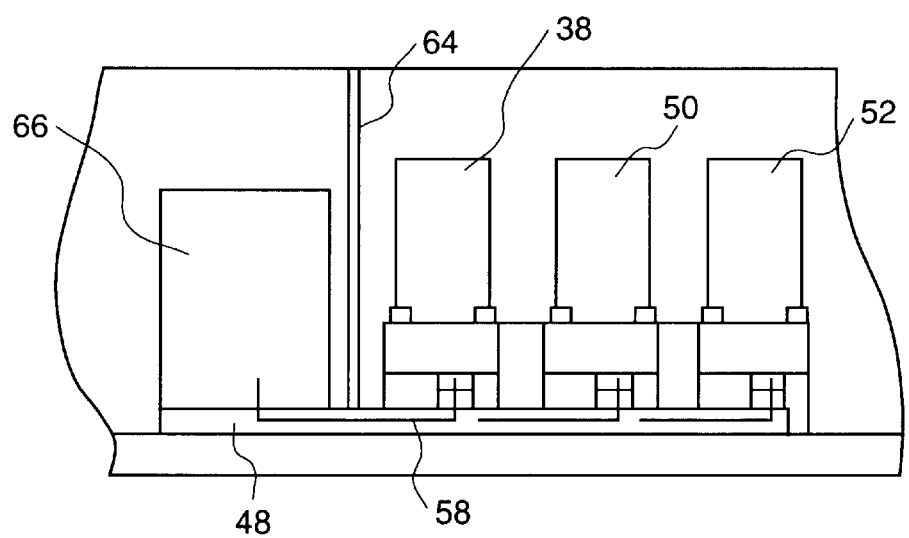
FIG. 4 is a view of assistance in explaining the constitution of a power supply unit and an MFC.
Figure 5:
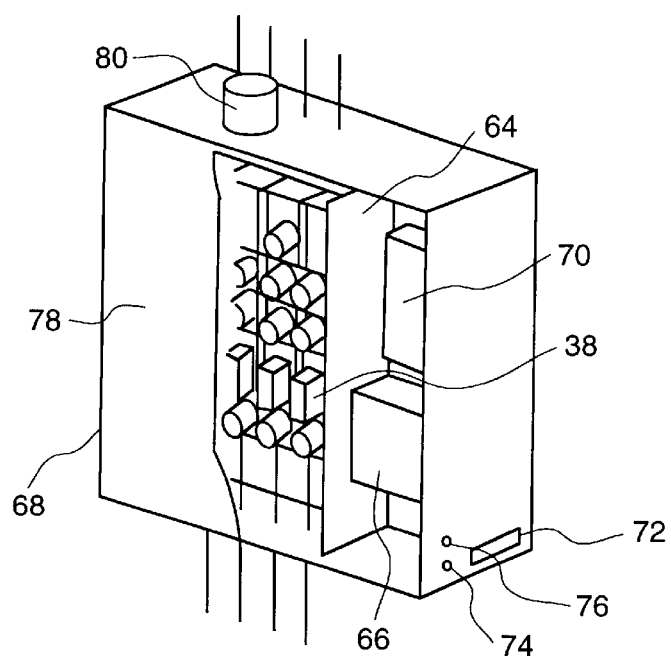
FIG. 5 is a perspective view showing the whole constitution of a gas supply apparatus according to one embodiment of the present invention.

The connector 62 is connected to a power supply unit 66 arranged adjacent to the MFC 38 with a partitioning plate 64 put therebetween, as shown in FIGS. 4 and 5. The power supply unit 66 is encased together with the MFC 38 and an electromagnetic manifold 70 within a casing 68 as the gas supply apparatus main body. Power (power supply) and a signal are supplied to the power supply unit 66 through the connector 72. The electromagnetic manifold 70 is constructed so that nitrogen is introduced from an air driving nitrogen introducing port 74, the operating valve 36 or 40 is controlled in accordance with the nitrogen introduced, and the nitrogen used for the aforesaid control is discharged out of an air driving nitrogen discharging port 76. Note that pipes in connection with the electromagnetic valve manifold are omitted. On a front panel 78 may be provided, for example, a liquid crystal display unit as a display unit for displaying a state of gas flow. On the other hand, when the front panel 78 is omitted, for example, a light emitting diode can be provided on the base 10 as a display unit for displaying a gas flow of each system. Further, when special high pressure gas such as silane, nitrogen trifluoride or the like is used, there possibly occurs a leakage of gas on the gas introducing side in the casing 68. Therefore, an exhaust duct 80 can be provided on the casing 68 so that gas in the casing 68 may be exhausted through the exhaust duct 80. It is also possible to provide a gas detecting nozzle and provide a control system for stopping a supply of gas when occurrence of leakage of gas within the casing 68 is detected.

Since according to the present embodiment, the connector 56 and the power supply and signal transmission portion 48 as a signal transmission means constituting the signal transmission system are arranged in the region surrounded by the manifold blocks 16, 18, the MFC 38 and the base 10, the signal transmission system is not projected upward of the MFC 38 to enable to make the occupying space small.

Figure 6:
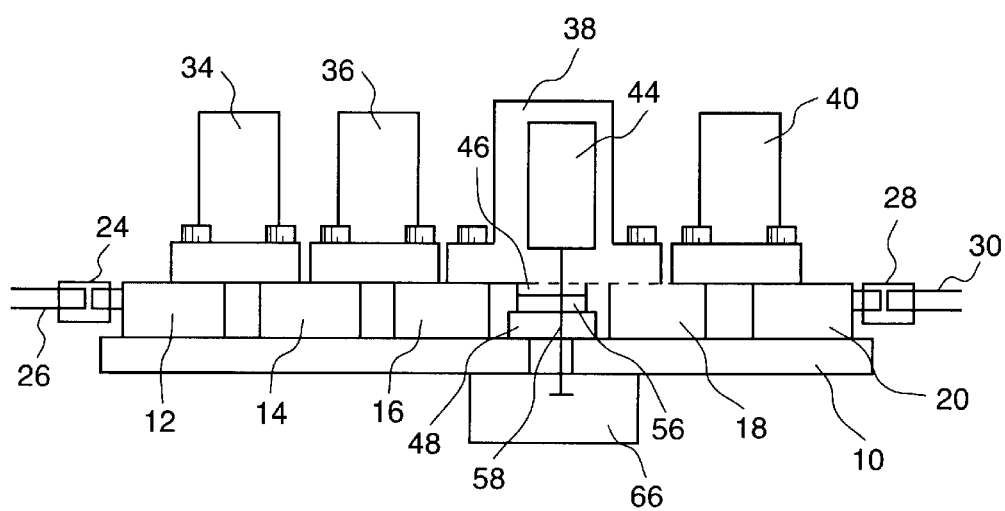
FIG. 6 is a front view showing main parts of a further embodiment of the present invention.
Figure 7:
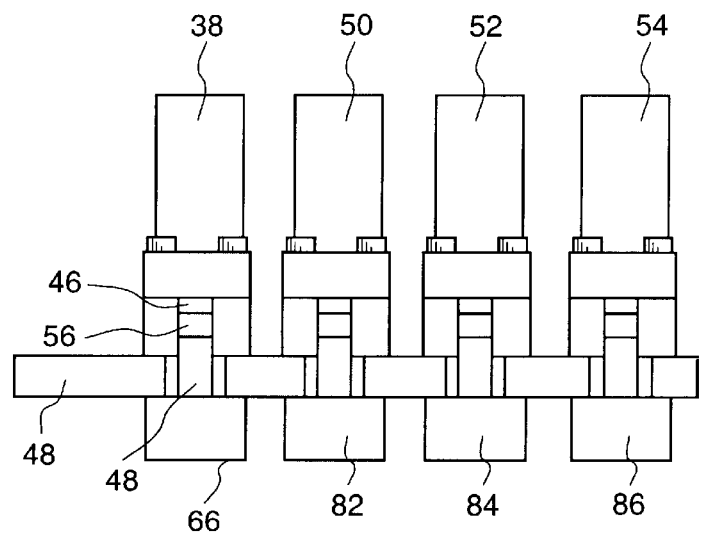
FIG. 7 is a side view showing main parts of another embodiment of the present invention.

Another embodiment of the present invention will be described hereinafter with reference to FIGS. 6 and 7.

In the present embodiment, power supply units 66, 82, 84 and 86 are provided at positions corresponding to the MFC 38, 50, 52 and 54 on the surface (bottom surface) opposite to the block secured surface of the base 10 (upper surface of the block), and other constitutions are similar to those mentioned in the previous embodiment. The power supply units 82, 84 and 86 are constituted of that is identical with the power supply unit 66.

Each of the power supply units 66, 82, 84 and 86 is provided with a D.C. power supply, which is connected to a connector 56 through a power supply and signal transmission portion 48.

In the present embodiment, instead of securing each of the power supply units 66, 82, 84, and 86 to the bottom surface of the base 10, each of the power supply units 66, 82, 84, and 86 may be arranged in a region between the MFCs 38, 50, 52 and 54 and the base 10.

Since in the present embodiment, the power supply units 66, 82, 84, and 86 can be arranged in close proximity to the MFCs 38, 50, 52 and 54, the gas supply apparatus can be miniaturized, and as the wiring length shortens, it can be less affected by the noise, thus enabling improvement in reliability.

Further, in the previous embodiment, in the case where the housing space is limited, other than the arrangement wherein the manifold blocks 12 to 20 are disposed in a straight line fashion, a part of the manifold blocks 12 to 20 is bent at right angles halfway whereby the limited space can be effectively utilized.

While in the previous embodiment, a description has been made of the case where the power supply unit 66 and the MFC 38 are connected using the connector, it is to be noted that the power supply unit 66 and the MFC 38 can be connected directly using the power supply line and the signal line.

Figure 8:
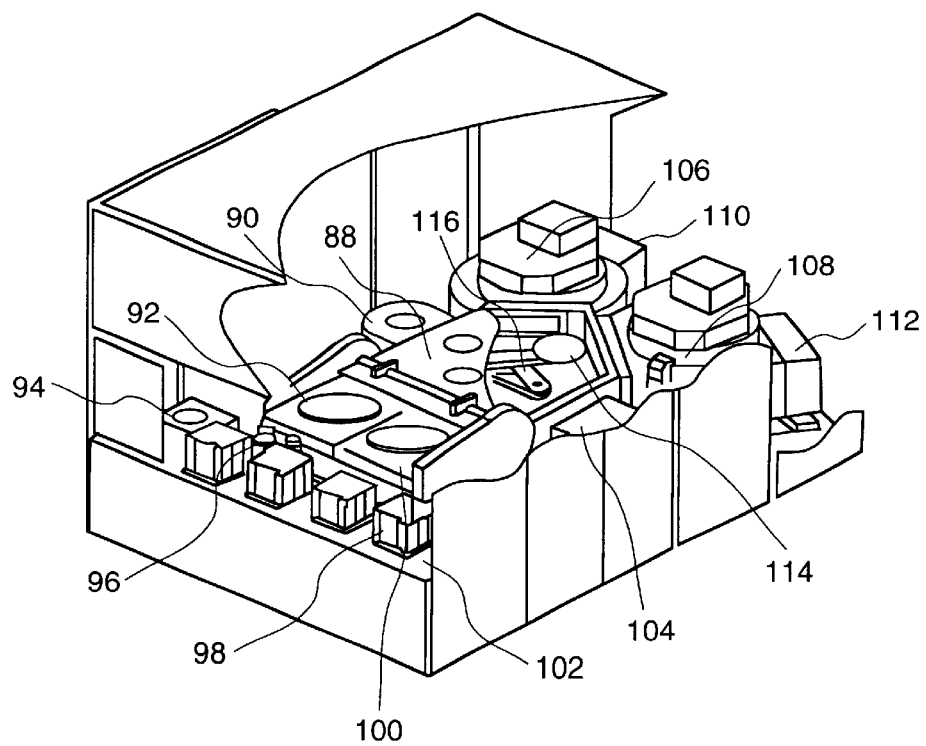
FIG. 8 is a perspective view of a plasma CVD device.

In the following an embodiment in which the gas supply apparatus in each of the previous embodiments is used for the plasma CVD apparatus will be described with reference to FIG. 8.

The plasma CVD apparatus as a film forming apparatus is composed of a carrying chamber 88, a cooling chamber 90, a laying-in chamber 92, a wafer alignment portion 94, an atmospheric robot 96, a wafer case 98, a take-out chamber 100, an atmospheric carrying unit 102, a housing unit 104, reaction chambers 106 and 108, gas supply apparatuses 110 and 112, and a vacuum carrying robot 116, the gas supply apparatuses 110 and 112 being arranged in close proximity to the reaction chambers 106 and 108, respectively. The wafer alignment portion 94 takes out wafers 114 one by one for alignment of the wafers 114. The wafers 114 taken out are carried to the respective chambers by the atmospheric carrying unit 102 having the atmospheric robot 96. At that time, the wafers 114 are carried from the carrying chamber 88 to the respective chambers. The laying-in chamber 92 causes the wafers 114 to place in the vacuum state from the atmosphere. The respective reaction chambers 106 and 108 receive process gas from the gas supply apparatuses 110 and 112 to accumulate insulating films on the wafers 114. The wafers 114 on which films are accumulated to elevate temperature are cooled in the cleaning chamber 90. When the reaction chambers 106 and 108 are subject to cleaning, dummy wafers in the housing unit 104 are used. When the wafers 114 having films accumulated are returned to the atmosphere from the vacuum, the wafers 114 are carried into the take-out chamber 100.

Since in the present embodiment, the gas supply apparatuses 110 and 112 are arranged in close proximity to the reaction chambers 106 and 108, respectively, the length of the gas supply flow path can be shortened, and the time till gas is stabilized when gas is supplied can be shortened. Further, the time at which the reaction chambers 106 and 108 assume regular vacuum after stoppage of a supply of gas can be shortened, thus enabling improvement of throughput. Further, since the miniaturized gas supply apparatuses 110 and 112 are arranged in close proximity to the reaction chambers 106 and 108, the occupying area of the whole apparatus can be reduced.

According to the present invention, the region between the elements constituting the gas supply flow path can be utilized for the region of the signal transmission system to make the occupying space small. Further, the wiring of the power supply line becomes shortened, the gas control means can be prevented from erroneous operation due to the noise, and the apparatus can be miniaturized.

What is claimed is:

1. A gas supply apparatus that supplies a process gas to a reaction chamber, comprising:

a base;

manifold blocks mounted on said base along a gas supply flow path and spaced apart from one another, each of said manifold blocks having an internal gas supply flow path;

one of said manifold blocks being connectable to a gas supply source and another of said manifold blocks being connectable to a reaction chamber;

a mass flow controller mounted on adjacent ones of said manifold blocks;

upstream and downstream operating valves adjacent said mass flow controller mounted on said manifold blocks for controlling gas flow along said gas flow path;

a filter mounted on said manifold blocks for filtering gas that flows along said gas flow path;

said mass flow controller having a connector for receiving signal transmission that is disposed in a region between said adjacent manifold blocks on which said mass flow controller is mounted.

2. The gas supply apparatus according to claim 1, wherein said connector for receiving signal transmission also receives power through connection with a power supply line.

3. The gas supply apparatus according to claim 2, further including a power supply and signal transmission support portion, wherein said connector is a first connector that is mounted on a surface of said mass flow controller opposed to said base and said first connector mates with a second connector mounted on said power supply and signal transmission support portion.

4. The gas supply apparatus according to claim 3, wherein said power supply and signal transmission support portion is mounted on a first surface of said base to extend beneath said mass flow controller between said adjacent mounting blocks.

5. The gas supply apparatus according to claim 3, further including a power supply mounted on a surface of said base opposite to said first surface and beneath said mass flow controller.

6. A film forming apparatus, comprising:

a reaction chamber that receives a process gas used in depositing a film on an object in the reaction chamber;

a gas supply apparatus for supplying process gas to the reaction chamber, comprising:

a base;

manifold blocks mounted on said base along a gas supply flow path and spaced apart from one another, each of said manifold blocks having an internal gas supply flow path;

one of said manifold blocks being connectable to a gas supply source and another of said manifold blocks being connectable to a reaction chamber;

a mass flow controller mounted on adjacent ones of said manifold blocks;

upstream and downstream operating valves adjacent said mass flow controller mounted on said manifold blocks for controlling gas flow along said gas flow path;

a filter mounted on said manifold blocks for filtering gas that flows along said gas flow path;

said mass flow controller having a connector for receiving signal transmission that is disposed in a region between said adjacent manifold blocks on which said mass flow controller is mounted.

* * * * *